(12) United States Patent
Lim

(10) Patent No.: US 6,300,774 B1
(45) Date of Patent: Oct. 9, 2001

(54) WITHSTAND VOLTAGE TESTING APPARATUS AND AUTOMATIC TESTING METHOD THEREOF

(75) Inventor: Joung-Su Lim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/098,551

(22) Filed: Jun. 17, 1998

(30) Foreign Application Priority Data

Jun. 17, 1997 (KR) .................................................. 97-25129

(51) Int. Cl.$^7$ ........................ G01N 27/00; G01R 31/08; G01R 31/02; B65G 47/22
(52) U.S. Cl. ........................ 324/558; 324/513; 324/758; 198/345.3
(58) Field of Search ..................... 324/754, 756, 324/758, 558, 517, 513, 418; 414/223, 222.03, 222.1, 222.12, 222.13; 198/345.1, 345.2, 345.3, 339.1; 702/121

(56) References Cited

U.S. PATENT DOCUMENTS

| | | |
|---|---|---|
| 3,750,878 | 8/1973 | Atchley . |
| 3,816,653 | 6/1974 | Bosiger . |
| 4,471,298 | 9/1984 | Frohlich . |
| 4,516,076 | 5/1985 | Pillari et al. . |
| 4,639,187 | 1/1987 | Maruyama et al. . |
| 4,755,747 | * 7/1988 | Sato ..................................... 324/760 |
| 5,002,175 | * 3/1991 | Drexel et al. ...................... 198/345.3 |
| 5,241,277 | 8/1993 | Kafalas . |
| 5,264,799 | * 11/1993 | Huang .................................. 324/726 |
| 5,297,059 | * 3/1994 | Kawasoe .............................. 702/121 |
| 5,461,317 | 10/1995 | Winter . |
| 5,461,324 | 10/1995 | Boyette et al. . |
| 5,504,432 | 4/1996 | Chandler et al. . |
| 5,514,967 | 5/1996 | Zelm . |
| 5,519,324 | 5/1996 | Tachikiri et al. . |
| 5,550,480 | * 8/1996 | Nelson ................................. 324/754 |
| 5,568,054 | * 10/1996 | Iino ..................................... 324/760 |

* cited by examiner

*Primary Examiner*—Safet Metjahic
*Assistant Examiner*—Anjan Deb
(74) *Attorney, Agent, or Firm*—Robert E. Bushnell, Esq.

(57) ABSTRACT

A withstand voltage testing apparatus and an automatic testing method thereof are capable of testing a withstand voltage by contacting/separating a test probe to/from a test position of an electronic product automatically and not manually. When a pallette is transported through a conveyor, the pallette is fixed by raising a stopper. Then, it is determined whether a monitor assembly as loaded on the transported pallette has arrived at an operating position. Vibration of the pallette is prevented by moving a pusher horizontally forward to contact one side of the pallette to press the pallette. A test probe moves forward and contacts the test position of the monitor assembly in order to perform a predetermined test. After testing is completed, the test probe connecting the monitor assembly moves backward and the fixed pallette is released by moving the pusher backward. After lowering the stopper, the pallette is transported to perform a next stage of the process.

22 Claims, 7 Drawing Sheets

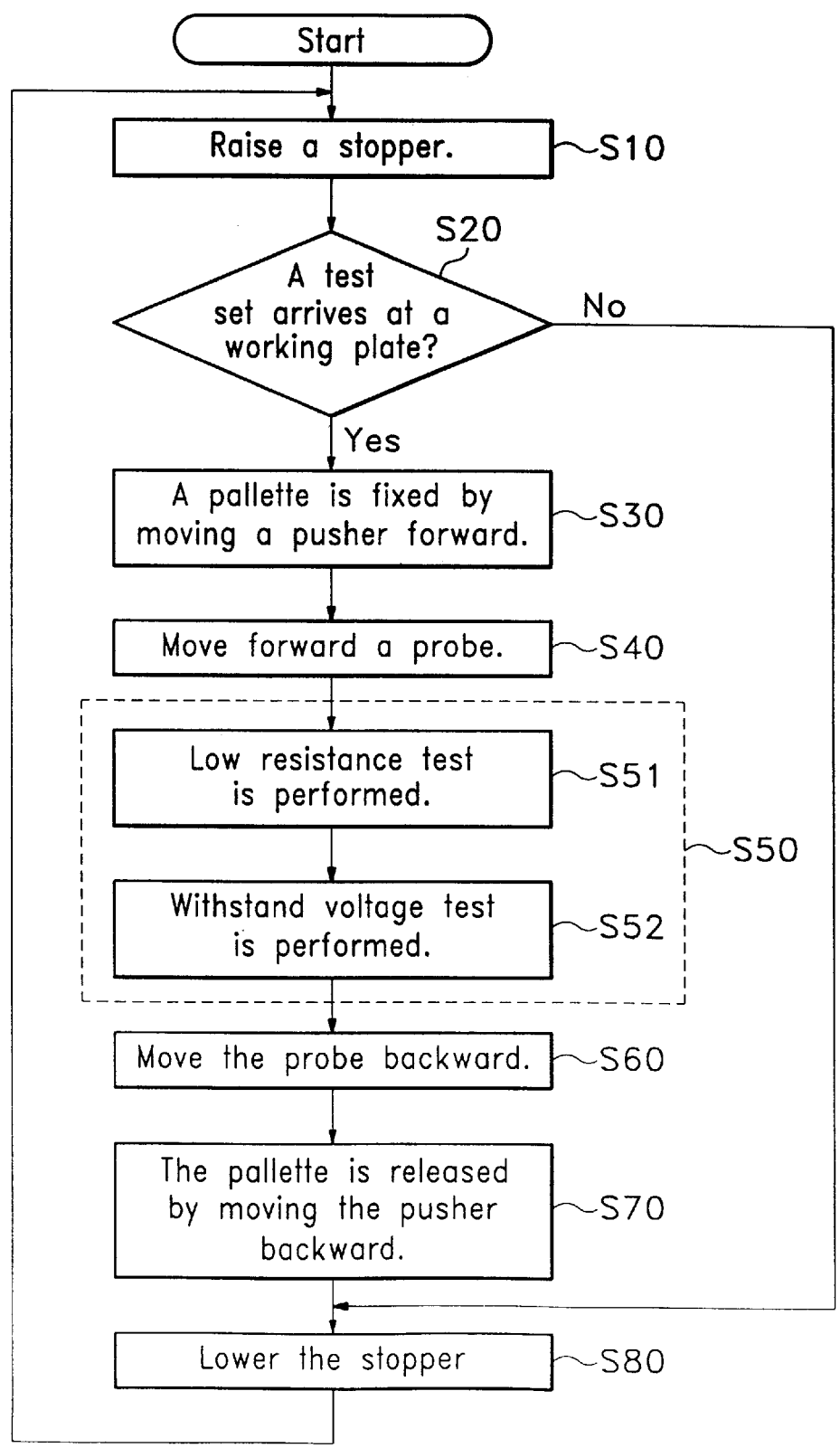

WITHSTAND VOLTAGE TESTING APPARATUS AND AUTOMATIC TESTING METHOD THEREOF

CLAIM OF PRIORITY

This application makes reference to, incorporates the same herein, and claims all benefits accruing under 36 U.S.C. §119 from an application for Withstand Voltage Testing Apparatus And Automatic Testing method Thereof earlier filed in the Korean Industrial Property Office on Jun. 17, 1997 and there duly assigned Ser. No. 25129/1997.

BACKGROUND OF THE INVENTION

1. Technical Field

The present invention relates to a withstand voltage testing apparatus and an automatic testing method thereof, and more particularly to a withstand voltage testing apparatus and an automatic testing method thereof capable of testing a withstand voltage by contacting/separating a test probe to/from a test position of an electronic product automatically and not manually.

2. Related Art

Generally, when various kinds of electronic products are assembled in a production line, several tests are per formed on the products. If the quality of the tested product is within a certain standard for the relevant product, the product is packed and sent out as a finished product.

Taking, as an example, a monitor assembly which is assembled from various electronic products, a withstand voltage test is explained.

A monitor is a product for optically sensing various kinds of video signals, as applied to many fields. In order to comply with standards of monitor performance and a user's request, it is necessary to perform strict test and adjustment in the production line. In order words, several testing and adjustments are performed in the production line and before the monitor is sent out in order to test whether the monitor displays the video signal on its screen properly. Thus, the monitor assembly is loaded on a pallette and transported to each stage in the monitor production line, and is tested regularly.

Two tests which have been determined to be helpful in the production of the electronic products are the low resistance test and the withstand voltage test. The low resistance test is performed in order to test whether an electronic circuit unit inside the electronic product (such as a monitor) and an outer case of the product are grounded, and to test whether a chassis ground and a power ground of the product being tested are exactly short-circuited. On the other hand, the withstand voltage test is used to check whether the product is insulated completely, and whether a second-side circuit of the power unit operates normally when a line terminal and a common load terminal from an alternating current (AC) first side power terminal, through which power is applied to the product, are short-circuited and a high voltage is applied between the line terminal and the common load terminal.

In the latter regard, since tilt voltage is applied to both the line and common load terminals of the AC power terminal of me product when performing the withstand voltage test, the operator performing the test necessarily exposes his or her body to high voltage and an accident can occur.

Therefore, there is a need for the development of a withstand voltage testing apparatus and related automatic testing method by means of which an operator is kept safe from electric shock. More specially, there is a need for the development of an apparatus and method for performing with and voltage testing of a product in which the test is performed without physical contact between the operator and a high voltage supply unit when a test probe is held in contact with a test terminal of the product being tested.

The following patents are considered to be representative of the prior art relative to the invention disclosed therein, but are burdened by the disadvantages set forth therein: U.S. Pat. No. 5,519,324 to Tachikiri, et al. entitled Withstand Voltage-Testing Apparatus which discloses a withstand voltage testing apparatus providing high voltage testing and warning display means; U.S. Pat. No. 5,461324 to Boyette et al. entitled Split-Fixture Configuration And Method For testing Circuit Traces On A Flexible Substrate which discloses testing circuit traces for shorts with movable probes sliding on rails and a conductive backing plate as compared with the conductive brush contacts #2 in the instant disclosure and "movable probe"; U.S. Pat. No. 5,514,967 to Zelm entitled Automatic Insulation Test Equipment For Testing High Voltage Electrical Equipment At The Rated Voltage Level which discloses automatic insulating test equipment for motors; U.S. Pat. No. 5,504,432 to Chandler et al. entitled System And Method For Detecting Short, Opens And Connected Pins On A Printed Circuit Board Using Automatic Test Equipment which discloses automatic testing of a plurality of nodes, for circuit board shorts and ground; U.S. Pat. No. 5,461,317 to Winter entitled Device For Testing For A High Voltage On The Chasis of A Piece Of Electronic Apparatus; U.S, Pat. No. 5,241,277 to Kefalas entitled Test System For Automatic Testing Of Insulation Resistance, Capacitance And Attenuation Of Each Contact Pair In A Filter Pin Connector which discloses automatic testing of insulation resistance with test fixture; U.S. Pat. No. 1,639,187 to Maruyama et al. entitled Automatic Storing Equipment which discloses electronic instruments stored and tested on a movable and automated pallet system; U.S. Pat. No. 4,516,076 to Pillari et al. entitled Fault Detection Arrangement For Relay Switching System which discloses an electromechanical and programmed relay arrangement for an automated tester; U.S. Pat. No. 4,471,198 to Frohlich entitled Apparatus For Automatically Electrically Testing Printed Circuit Boards which discloses automated and sequential voltage testing of printed circuit boards with movable probe; U.S. Pat. No. 3,816,653 to Bosiger entitled Television Test Apparatus which discloses television chassis testing via switching modules and impedance matching; and U.S. Pat. No. 3,750,878 to Atchley et al. entitled Electrical Component Testing Apparatus which discloses capacitor component, electronic testing via conductive contact plates and a conveyor system.

SUMMARY OF THE INVENTION

Therefore, it is an object of the present invention to provide a withstand voltage testing apparatus and an automatic testing method thereof capable of keeping an operator safe from electric shock by performing the test without physical contact between the operator and a high voltage supply unit when a test probe is held in contact with a test terminal of a monitor assembly which is being tested.

According to one aspect of the present invention, a withstand voltage testing apparatus includes: a stopper for stopping pallette loading of a monitor assembly which is transported on a conveyor in front of an operator; a pusher for pressing and fixing the pallette vertically relative to a pallette moving direction, enabling the stopped pallette not to be vibrated; a movable probe which is connected to a test position of the monitor assembly when the pallette is pressed and fixed by the pusher; a transporting rail for transporting the probe to contact the test position; and a control circuit unit for moving the probe in order to connect the probe and an electrifying brush to + and − test terminals of each of a withstand voltage tester and a low resistance tester in an alternating manner by controlling a certain relay circuit when the probe is connected to the test position, and then controlling the movement of the transporting rail.

According, to another aspect of the present invention, when the pallette is transported through the conveyor, the pallette is fixed by raising the stopper. Afterwards, it is determined whether the monitor assembly loaded on the transported pallette has arrived at an operating position. The vibration of the pallette is prevented by moving the pusher horizontally forward to contact one side of the pallette so as to press the pallette. The test probe moves forward and is connected in a test position to the monitor assembly in order to perform a predetermined test. After testing is completed, the test probe connected to the monitor assembly moves backward and the fixed pallette is released by moving the pusher backward. After lowering the stopper, the pallette is transported to a next stage of the process.

It is possible to simultaneously perform a low resistance test for testing a ground state of a power terminal of the monitor assembly and a withstand voltage test.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein;

FIG. 6 is it flowchart illustrating a method for automatically testing a withstand voltage according to the present invention.

DETAILED DESCRIPTION OF THE PREFERRED EMBODIMENTS

The objects, characteristics and advantages of the above-described invention will be more clearly understood through the preferable embodiments referring to the attached drawings.

Figure 1A:
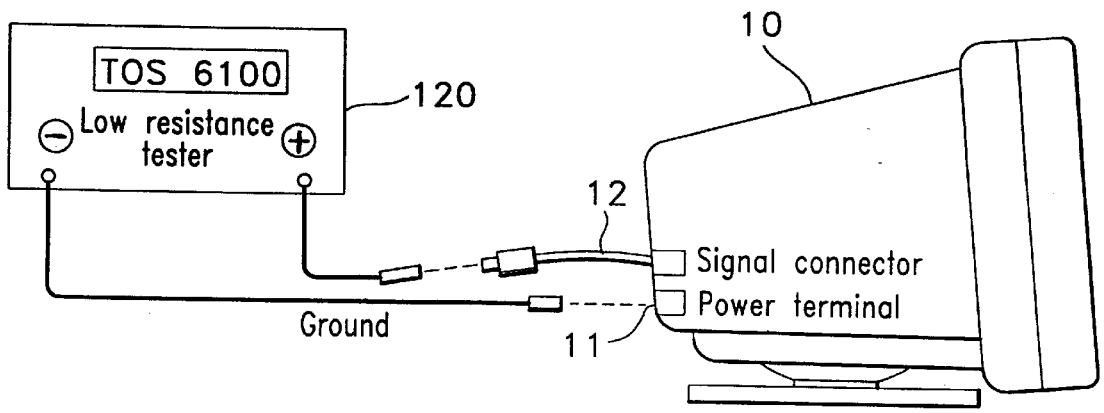
FIG. 1A is a structural view roughly illustrating a low resistance testing environment.
Figure 1B:
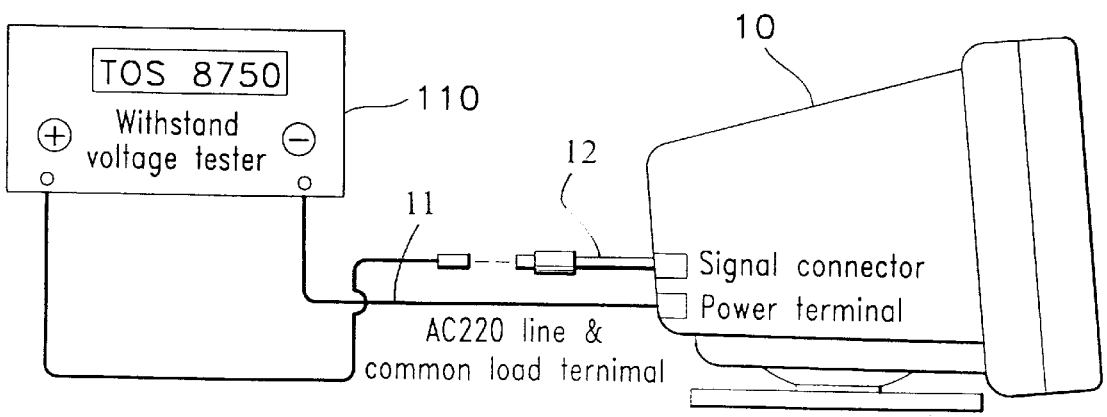
FIG. 1B is a structural view roughly illustrating a withstand voltage testing environment.

FIG. 1A is a structural view roughly illustrating a low resistance testing environment; and FIG. 1B is a structural view roughly illustrating a withstand voltage testing environment.

As shown in the drawings, an operator performs a low resistance test and a withstand voltage test by holding + and − test probes of each of a low resistance tester 120 and a withstand voltage tester 110 and by directly contacting the and + and − test probes to an alternating current (AC) power terminal 11 of the monitor assembly 10 which is a test set and to a ground terminal of a signal connector 12, respectively. The signal connector 12 includes fifteen (15) pins of connecting terminals, including the ground terminal.

More specifically the low resistance test is to test whether an electronic circuit unit inside of the monitor 10 and an outer case are grounded, and a chassis ground and a power ground of the monitor assembly 10 being tested are exactly short-circuited.

As shown in FIG. 1 the − terminal of the low resistance tester 120 is connected to the ground terminal out of the power terminal 11 of the monitor assembly 10, and the − terminal is connected to the ground terminal of the signal connector 12 of the monitor assembly. Under the above test environment, after applying a current of 25 A to the power terminal 11 of the monitor assembly 10 for three seconds continuously, resistance is measured. If the resistance value displayed in the low resistance tester 120 is within 0 to 0.1 Ohm, the monitor 10 is determined to be a good product.

The withstand voltage test is used to check whether the product is insulated completely and a second-side circuit of the power unit of the monitor assembly operates normally, when a 220 V line terminal and a common load terminal from an AC first side power terminal through which the power is applied to the monitor assembly 10 are short-circuited and a high voltage (i.e., 2.4 kV of direct current) is applied between the 220 V line terminal and the common load terminal.

As shown in FIG. 1B, the − terminal of the withstand voltage tester 110 is connected to the 220 V line terminal and common load terminal from the power terminal 11 of the monitor assembly 10, and the + terminal is connected to the ground terminal of the signal connector 12 of the monitor assembly 10. The standard which is required in the withstand voltage test is that a product have no malfunction when a direct voltage of 2.4 kV and a current of 2 mA are applied for three seconds.

If a printed circuit board (PCB) which is corroded is assembled in the monitor assembly 10 and is used as a main board, corrosion around a circuit pattern of the PCB occurs as a predetermined time elapses, and thereby the circuit pattern is short-circuited. In the worst case, a fire can break out.

When inferiority is found by users during use of a product, the users' reliance on the product is reduced. As a result, it is necessary to perform the above test in the production line and to check the products before they are sent out in order to reduce the sale of inferior goods.

In addition, an imperfect assembly which occurs during assembly of the monitor assembly 10 can be checked. In other words, an unfastened screw or a metal piece capable of generating a short circuit can be detected through the test.

However, since the high voltage of about 2.4 kV is applied to both line and common load terminals of the AC power terminal 11 of the monitor 10 when performing the withstand voltage test, and since the operator in performing the test exposes his body to high voltage, an accident can occur frequently.

Figure 2:
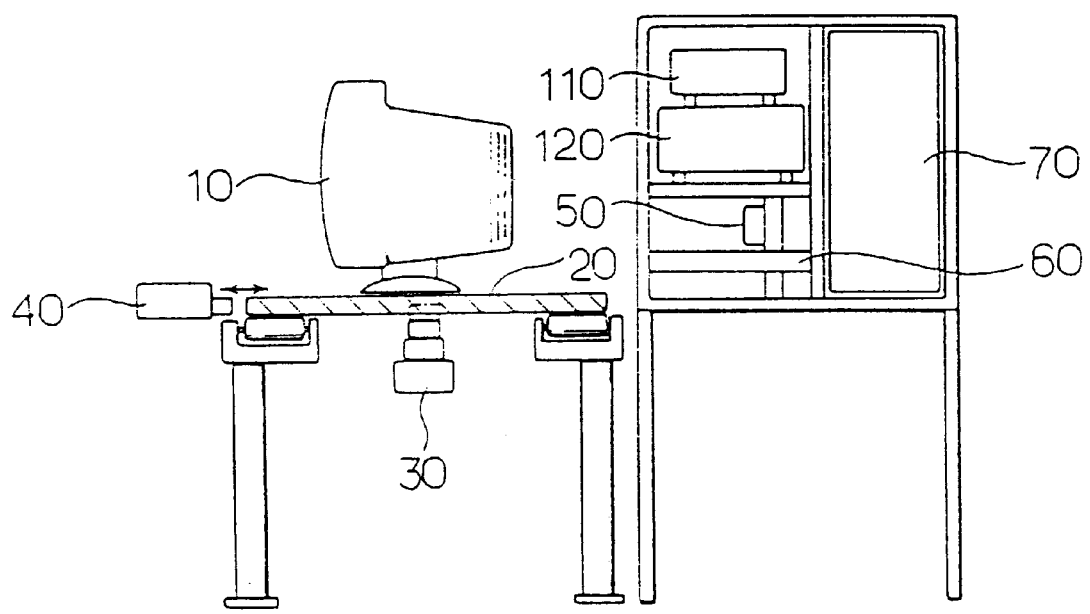
FIG. 2 is a structural view roughly illustrating a withstand voltage testing apparatus according to the present invention.
Figure 3:
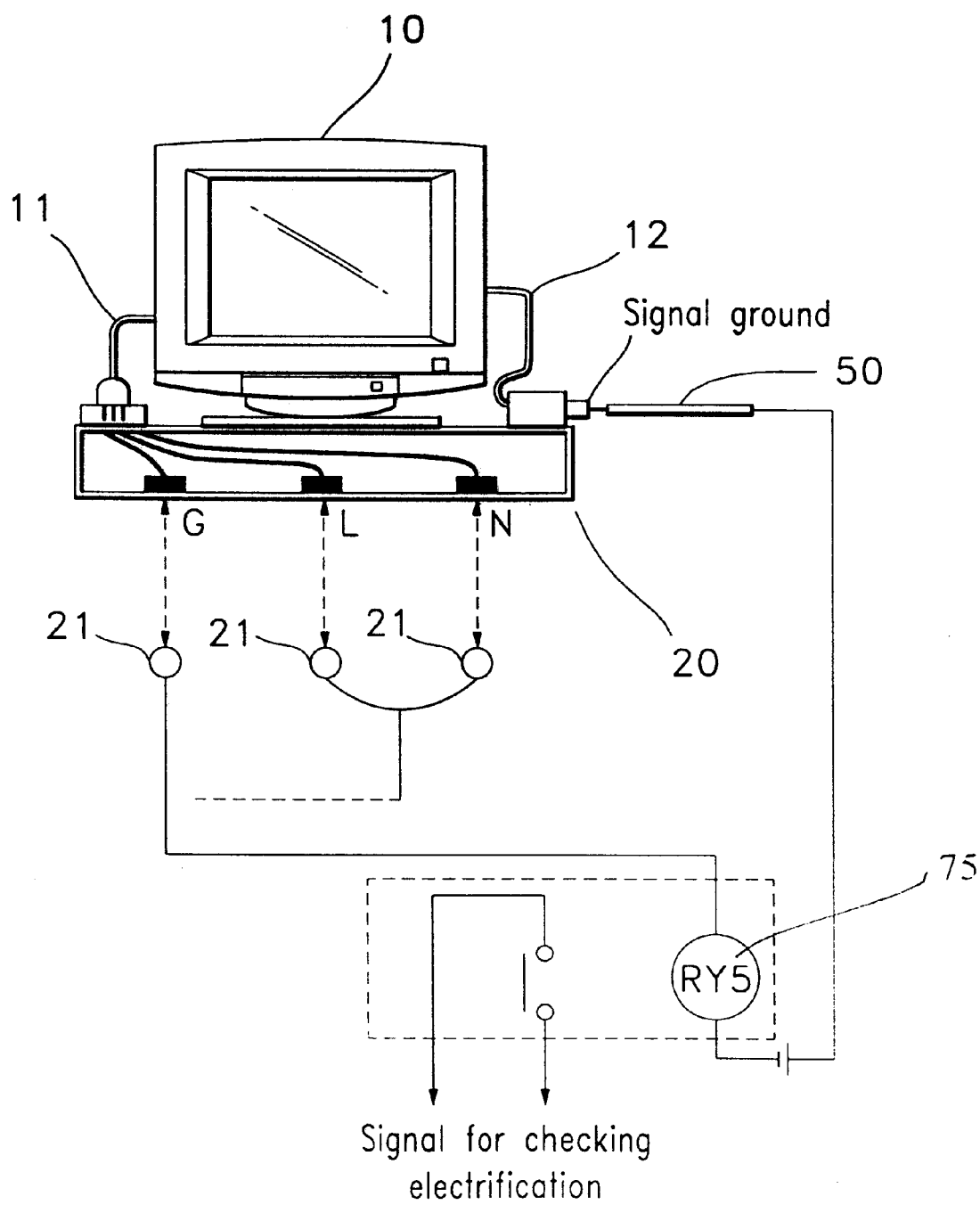
FIG. 3 is a structural view roughly illustrating a testing apparatus for performing an electrical test in FIG. 2 according to the present invention.
Figure 4A:
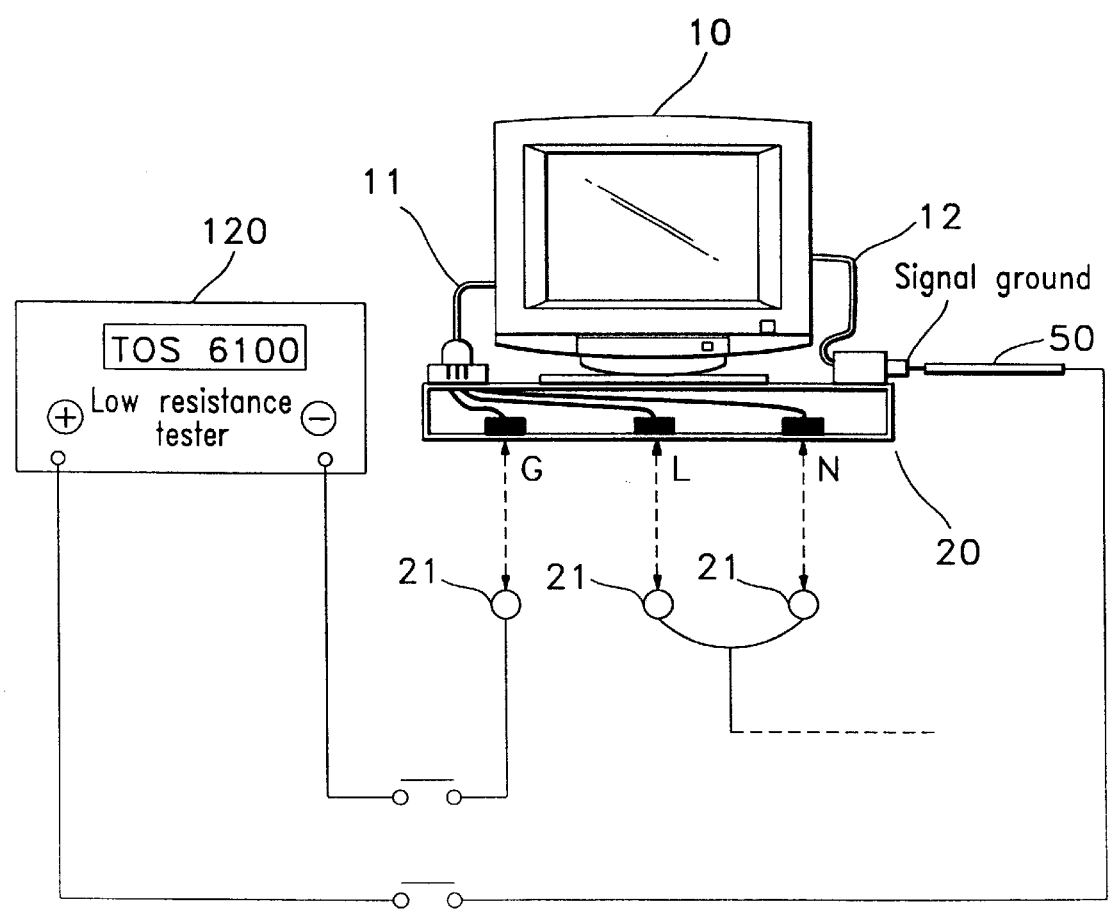
FIG. 4A is a structural view roughly illustrating a testing apparatus for performing a low resistance test in FIG. 2 according to the present invention.
Figure 4B:
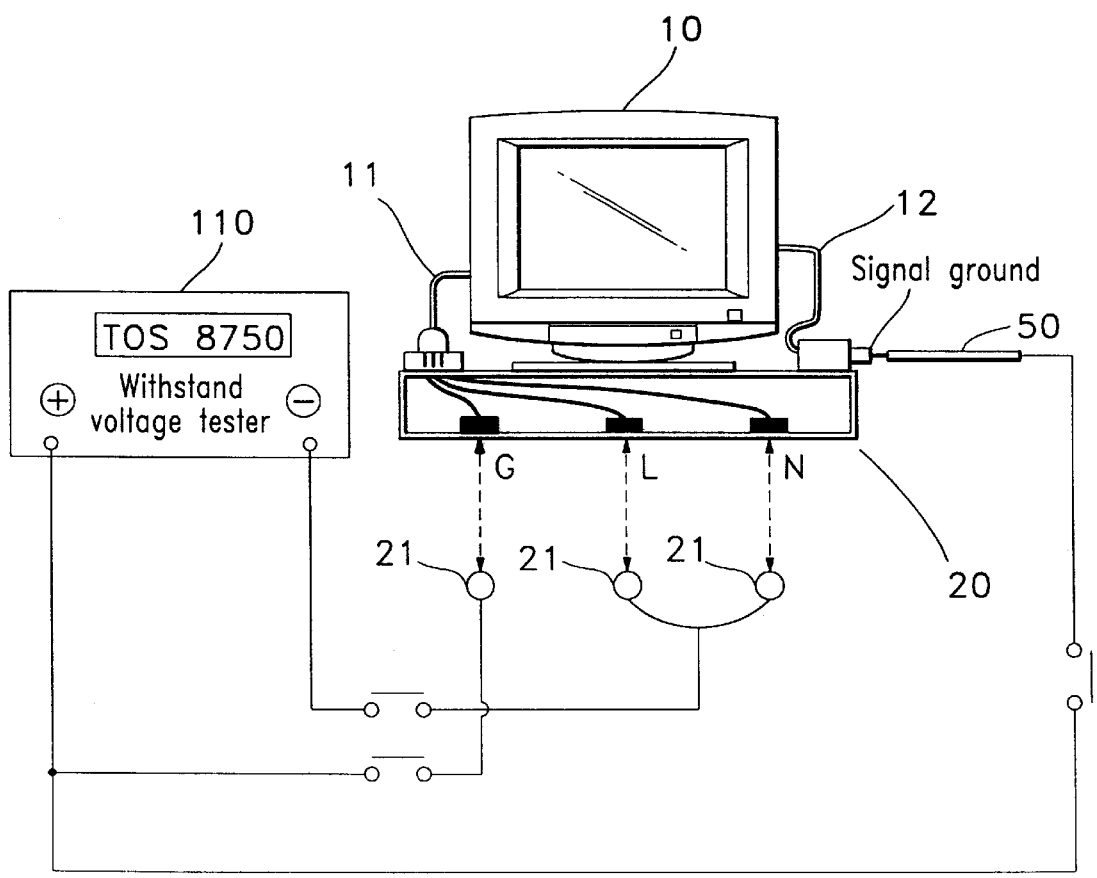
FIG. 4B is a structural view roughly illustrating a testing apparatus for performing a withstand voltage test in FIG. 2 according to the present invention.

FIG. 2 is a structural view roughly illustrating a withstand voltage testing apparatus, and FIG. 3 is a structural view roughly illustrating a testing apparatus for performing an electrical test in FIG. 2 according to the present invention. FIG. 4A is a structural view roughly illustrating a testing apparatus for performing a low resistance test, and FIG. 4B is a structural view roughly illustrating a testing apparatus for performing a withstand voltage test in FIG. 2 according to the present invention. In addition, FIG. 5 is a circuit diagram illustrating a control circuit unit of the withstand voltage test apparatus in FIG. 2, and FIG. 6 is a flowchart illustrating a method for automatically testing the withstand voltage according to the present invention.

As shown in FIG. 2, a low resistance tester 120, which is one of component parts of the withstand voltage testing apparatus according to the present invention, is a measuring instrument for testing a ground resistance value between a power ground of a monitor assembly 10 and an outer case. A withstand voltage tester 110 is a measuring instrument for testing an insulation state of a product by applying a certain high voltage at a test position of the monitor assembly 10.

As shown in FIGS. 2 to 5, the withstand testing apparatus according to the present invention includes: a stopper 30 for stopping a pallette 20 on which a monitor assembly 10 is transported along a conveyor in front of an operator; a pusher 40 for pressing and fixing the pallette 20 in a direction perpendicular to a pallette moving direction enabling the stopped pallette 20 not to be vibrated; a movable probe 50 which is connected to a test position of the monitor assembly 10 when the pallette 20 is pressed and fixed by the pusher 40; a transporting rail 60 for transporting the probe 50 into contact with the test position; and a control circuit unit 70 for moving the probe 50 in order to connect the probe to + and − test terminals of each of the withstand voltage tester 110 and the low resistance tester 120 in alternating turns by controlling a certain relay circuit when the probe 50 is connected to the test position, and then controlling the movement of the transporting rail 60.

Figure 5:
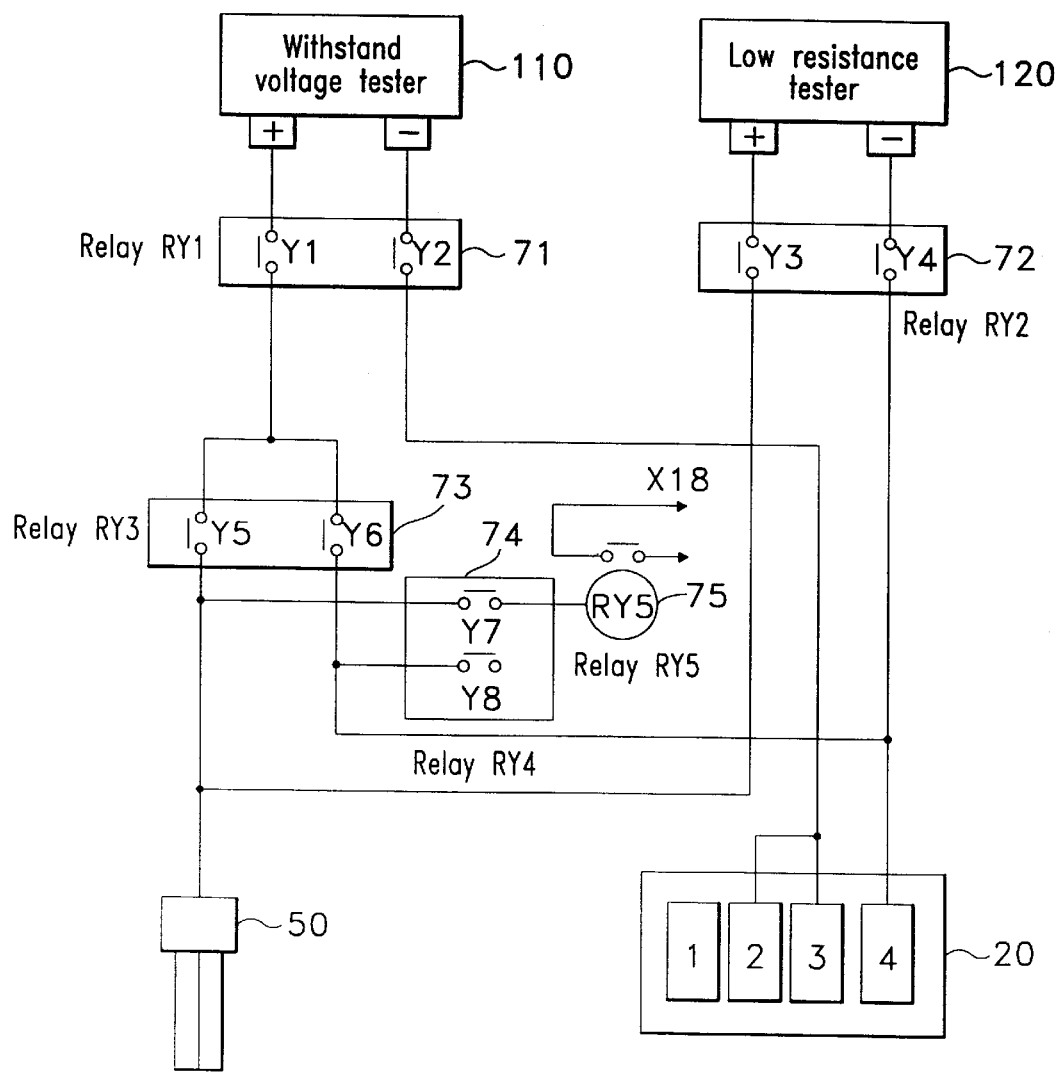
FIG. 5 is a circuit diagram illustrating a control circuit unit of the withstand voltage test apparatus in FIG. 2 according to the present invention.

Referring to FIG. 5, the pallette 20 used in the testing process is equipped with copperplate patterns 1, 2, 3 and 4, each having a predetermined width at its rear surface. The copperplate patterns 1, 2, 3 and 4 are connected to a sensor and three terminals of a power terminal of a power cable 11 of the monitor assembly 10 i.e., an AC 220 V line terminal, a common load terminal and a ground terminal, respectively. When the test is performed, the copperplate patterns 1, 2, 3 and 4 are connected to one end of an electrifying brush 21 (FIG. 3), the end of which is connected to the test terminal of the testing apparatus so as to test the monitor assembly 10.

The electrifying brush 21 illustrated in FIG. 3 connects the + and − leads of the tester for performing a certain test to the copper plates 2, 3 and 4 which are formed at the rear surface of the pallette 20 through the control circuit unit 70 and are connected to the ground terminal (G), AC 220 V line terminal (L), and the common load terminal respectively.

The method for automatically testing the withstand voltage of the present invention applied to the withstand testing apparatus having the above structure is explained with reference to FIG. 6.

FIG. 6 is flowchart illustrating the method for automatically testing the withstand voltage according, to the present invention.

As shown in the drawing, the method for automatically testing the withstand voltage according to the is present invention includes the step of: raising the stopper 30 in order to fix the pallette 20 transported on the conveyor (step S10); checking whether the monitor assembly S10 to be tested, as loaded on the pallette 20, has arrived at the working position (step S20); preventing the vibration of the pallette 20 due to movement of the conveyor by moving the pusher 40 forward to contact one side of the arrived pallette 20 so as to press the pallette 20 (step S30); moving the test probe 50 forward to contact the test position of the monitor assembly 10 (step S40); performing a certain test when the test probe 50 contacts the test position of the monitor assembly 10 (step S50); moving the test probe 50 connected to the test set backward when the test of step S50 is completed (step S60); moving the pusher 40 backward to release the fixed pallette 20 (step S70); and lowering the stopper 30 to transport the pallette 20 to the next stage of the process (step S80).

The step S50 of performing a certain test includes the steps of: performing the low resistance test to test the ground state of the power terminal in the monitor assembly 10 (step S51); and performing the withstand voltage test (step S52).

The method for automatically testing the withstand voltage of the present invention is explained in detail.

First, in order to fix the pallette 20 as transported on the conveyor from the production line to the test position, the stopper 30 is raised (step S10).

It is determined whether the monitor assembly 10 to be tested is loaded on the transported pallette 20 (step S20). When the monitor assembly 10 is not loaded, the stopper 30, which is raised at step S10, is lowered and the empty pallette 20 is transported, and thereby the process returns to step S10.

When the monitor assembly 20 is on the pallette 20, the vibration of the pallette 20 due to movement of the conveyor is prevented by moving the pusher 40 forward horizontally to contact one side of the transported pallette 20 so as to press the pallette 20 (step S30).

Afterwards, for a certain test, the test probe 50 moves forward and contacts the test position of the monitor assembly 10 (step S40).

When the test probe 50 contacts the test terminal of the monitor assembly 10, the testing environment is first checked under the control of the control circuit unit 70. In other words, a programmable logic controller (not illustrated) turns on a relay RY4 or 74 (FIG. 5) for the electrifying test, and relay contact points Y7 and Y8 are turned on. After checking the connection state between the test probe 50 and the ground terminal (G) of the pallette 20, a relay RY5 or 75 is turned on/off. By feeding back a signal X18, which is generated when the relay RY5 or 75 is turned on/off, to the programmable logic controller (not illustrated), it is determined whether the low resistance test and the withstand voltage test are continuing or not.

When the relay RY4 or 74 is turned on and a signal X18 is turned off, the next test is not performed and the inferior connection state is reported to an operator. At this time, after performing complementary measures, the test is performed.

On the other hand, when the signal X18 is turned on, contact points Y3 and Y4 of a relay RY2 or 72 are tuned on, and contact points of the other relays 71 and 73–75 are turned off. At this time, the low resistance testing environment is set, and the low resistance test is performed.

When the result of the resistance test is within a certain standard, a 'Good' signal is outputted. On the contrary, when it is not within the certain standard, a 'FAIL' signal is outputted. When the 'FAIL' signal is outputted, the next withstand voltage test process is not performed.

When the test result is within the certain standard, contact points Y1, Y2, Y5 and Y6 of relays RY1 or 71 and RY3 or 73 are turned on. Contact points of the other relays 72 and 74–75 are turned off. After setting the withstand voltage testing environment, the withstand voltage test is performed by the withstand voltage tester 110. In other words, by applying a high voltage to a certain position of the monitor assembly 10, the inferiority of the product is tested (step S50). The inferiority tested at step S50 is determined according to the safety standard which is previously set regarding the test set.

The testing environment means a state in which the + and − leads of the low resistance tester 120 and the withstand tester 110 move in turns, and are connected to a certain test position of the monitor assembly 10. That is, at step S51 of testing the low resistance, when the low resistance tester 120 contacts the contact points of Y3 and Y4 of the relay RY2 or 72 and the test probe 50 is connected to a relevant test terminal of the monitor assembly 10, the low resistance tester tests the ground resistance values of a chassis ground and the power ground of the monitor assembly 10 and checks whether the monitor assembly 10 is in compliance with the set standard value.

Afterwards, at step S52 of testing the withstand voltage, when the withstand voltage tester 110 is connected to the contact points Y1 and Y2 of the relay RY1 or 71 and the test probe 50 is connected to a relevant test terminal of the monitor assembly 10, the withstand voltage tester 110 applies a high voltage of about 2.4 kV to the test position of the monitor assembly 10 and checks whether the monitor assembly 10 is in compliance with the set standard value.

When all testing is completed at step S50, the test probe 50 connected to the relevant test terminal of the monitor assembly 10 moves backward (step S60).

Then, the pusher 40 moves backward to release the pallette 20, which was fixed at step S30 (step S70), and the stopper 30 is lowered to transport the pallette 20 carrying the monitor assembly 10 to the next process (step S80).

By performing the step S10 to S80 with respect to one monitor assembly 10 which is to be tested, the automatic withstand voltage test is completed. In order to test a monitor assembly which is newly transported from a previous stage of the process, step S10 to S80 are performed again.

As described above, according to the withstand voltage testing apparatus and the automatic testing method of the present invention, since the operator need not manually connect/separate the test probe for applying the high voltage directly to/from the test terminal of the monitor assembly, the operator is not present at the position where the high voltage is applied, thereby protecting the operator from the danger of electric shock.

In addition, by automatically connecting the test probe to the monitor assembly which is the test target, unnecessary operations are reduced and productivity is enhanced.

While there have been illustrated and described what are considered to be preferred embodiments of the present invention, it will be understood by those skilled in the art that various changes and modifications may be made, and equivalents may be substituted for elements thereof, without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A withstand voltage testing apparatus comprising:
   stopper means for stopping a pallette carrying a monitor assembly which is transported via a conveyor in front of an operator;
   pusher means for pressing and fixing said pallette in a direction perpendicular to a pallette moving direction so as to prevent said stopped pallette from being vibrated;
   a movable probe which is connected to a test position of said monitor assembly when said pallette is pressed and fixed by the pusher means;
   a transporting rail for transporting said probe to contact said test position; and
   control circuit unit means for moving said probe in order to connect said probe and an electrifying brush to at least one of + and − test terminals of each of a withstand voltage tester and a low resistance tested in alternating turns, and for controlling the movement of said transporting rail.

2. An apparatus of claim 1, wherein said control circuit unit means comprises a control circuit for moving said probe in order to connect said probe and said electrifying brush to + and − test terminals of each of a withstand voltage tester and said low resistance tester, and a relay circuit responsive to said control circuit when said probe is connected to said + and − test terminals for applying a predetermined voltage to said + and − test terminals.

3. The apparatus of claim 1, wherein said control circuit unit means moves said movable probe to connect said movable probe and said electrifying brush to both said + and − test terminals of each of the withstand voltage tester and the low resistance tester in alternating turns.

4. The apparatus of claim 1, wherein said control circuit means comprises an electrifying test relay which is actuated when said product is in said operating position so as to check a connection state between said probe and a ground terminal of the pallette.

5. A method for automatically testing a withstand voltage comprising the step of:
   raising a stopper in order to stop and fix a pallette transported through a conveyor in a moving direction of said pallette;
   checking whether a product to be tested, as carried by said transported pallette, has arrived at a working position;
   preventing vibration of said pallette due to movement of said conveyor by moving a pusher horizontally forward in a direction perpendicular to the moving direction of said pallette to contact one side of said arrived pallette and to press said pallette;
   moving a test probe forward to contact said test position of a product to be tested;
   performing a certain test when said test probe contacts said test position of the product to be tested;
   moving said test probe backward when the certain test is completed;
   moving said pusher backward to release said fixed pallette; and
   lowering said stopper to transport said pallette to a next stage of the method;
   said method further comprising the step of using an electrifying test relay actuated when said product to be tested is in said working position so as to check a connection state between said test prove and a ground terminal of the pallette.

6. The method of claim 5, wherein said step of performing a certain test comprises the step of:

performing at least one of a low resistance test to test a ground state of a power terminal in the product to be tested and a withstand voltage test.

7. A withstand voltage test apparatus for use in testing a product carried by a pallette which is transported via a conveyer to an operating position, said apparatus comprising:

stopper means for stopping said pallette in front of said operating position;

preventing means for operating said pallette to prevent said pallette from being vibrated;

a movable probe connected to a test position of said product when said pallette is operated on by said preventing means; and control circuit means for controlling movement of said probe so as to move said probe into contact with said product so as to perform at least one of a withstand voltage test and a low resistance test;

wherein said control circuit means comprises an electrifying test relay which is actuated when said product is in said operating position so as to check a connection state between said probe and a ground terminal of the pallette.

8. The apparatus of claim 7, wherein said control circuit means further comprises a low resistance test relay which is turned on when said low resistance test is to be performed.

9. The apparatus of claim 8, further comprising means for outputting a first signal when a result of performance of said low resistance test falls within acceptable standards, and for outputting a second signal when the result of the low resistance test falls outside of the acceptable standards.

10. The apparatus of claim 8, wherein said control circuit means further comprises at least one withstand voltage test relay which, when a result of the low resistance test falls within a certain standard, is turned on so as to perform the withstand voltage test.

11. The apparatus of claim 7, wherein said control circuit means further comprises at least one withstand voltage test relay which is turned on so as to perform the withstand voltage test.

12. The apparatus of claim 7, wherein said preventing means comprises a pusher for pressing and fixing said pallette in a direction perpendicular to a pallette moving direction so as to prevent said stopper pallette from being vibrated.

13. The apparatus of claim 12, wherein said pusher releases said pallette when all testing of said products is completed.

14. The apparatus of claim 7, wherein said preventing means releases said pallette when all testing of said product is completed.

15. The apparatus of claim 7, further comprising a transporting rail for transporting said probe to contact said test position of said product.

16. The apparatus of claim 7, wherein said product being tested comprises a monitor assembly.

17. The apparatus of claim 7, wherein said control circuit means moves said probe in order to connect said probe and an electrifying brush to + and − test terminals of each of a withstand voltage tester and a low resistance tester in alternating fashion.

18. The apparatus of claim 7, wherein the following operations are performed in sequence:

said stopper means is raised in order to stop and fix said pallette transported through said conveyor;

said control circuit means checks whether the product to be tested, as carried by said transported pallette, has arrived at said operating position;

said preventing means prevents vibration of said pallette due to movement of said conveyor by moving a pusher horizontally forward to contact one side of said arrived pallette and to press said pallette;

said movable probe is moved forward to contact said test position of said product;

said control circuit means performs a certain test when said movable probe contacts said test position of said product;

said control circuit means moves said movable probe backward when the certain test is completed, moves said pusher backward to release said pallette, and lowers said stopper means to transport said pallet ie to a next stage.

19. A method of automatically testing a withstand voltage of a product transported on a pallette in a moving direction of said pallette via a conveyer to a working position, said method comprising the step of:

stopping and fixing said pallette transported via said conveyer;

checking whether said product, as carried by said transported pallette, has arrived at said working position;

preventing vibration of said pallette due to movement of said conveyer by using a pusher to press and fix said pallette in a direction perpendicular to the moving direction of said pallette;

moving a test probe forward to contact a test position of said product;

performing a predetermined test when said test probe contacts said test position of said product;

moving said test probe backward when said predetermined test is completed;

releasing said fixed pallette; and operating said stopper to release said pallette and to transport said pallette to a next stage;

said method further comprising the step of using an electrifying test relay which is actuated when said product to be tested is in said working position so as to check a connection state between said test probe and a ground terminal of the pallette.

20. The method of claim 19, wherein said step of performing said predetermining test comprises performing at least one of a low resistance test and a withstand voltage test.

21. The method of claim 19, wherein said step of preventing vibration of said pallette comprises moving the pusher horizontally forward to contact one side of said pallette when said pallette has arrived at said working position, thereby pressing and fixing said pallette.

22. The method of claim 19, wherein said step of releasing said pallette comprises lowering a stopper so as to permit said pallette to transport said product to said next stage.

* * * * *